United States Patent
Ikeda et al.

(10) Patent No.: US 8,242,568 B2
(45) Date of Patent: Aug. 14, 2012

(54) SEMICONDUCTOR DEVICE AND FABRICATION METHOD THEREOF

(75) Inventors: Keiji Ikeda, Yokohama (JP); Tsutomu Tezuka, Yokohama (JP); Yoshihiko Moriyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 145 days.

(21) Appl. No.: 12/888,674

(22) Filed: Sep. 23, 2010

(65) Prior Publication Data
US 2011/0180847 A1 Jul. 28, 2011

(30) Foreign Application Priority Data
Jan. 22, 2010 (JP) .................... 2010-012528

(51) Int. Cl.
*H01L 29/76* (2006.01)
(52) U.S. Cl. .................. 257/401; 257/E27.096
(58) Field of Classification Search .............. 257/19, 257/220, 302, 341, 401, E27.096, E29.183
See application file for complete search history.

(56) References Cited

U.S. PATENT DOCUMENTS

| 7,198,995 B2 * | 4/2007 | Chidambarrao et al. ..... 438/157 |
| 2004/0262687 A1 | 12/2004 | Jung et al. |

FOREIGN PATENT DOCUMENTS

| JP | 2007-515808 | 6/2007 |
| JP | 2007-258485 | 10/2007 |
| JP | 2008-34427 | 2/2008 |
| JP | 2008-546181 | 12/2008 |
| JP | 2009-94229 | 4/2009 |
| JP | 2009-267021 | 11/2009 |

OTHER PUBLICATIONS

Chung, Cheng-Ting, et al., "Low-dislocation-density 50 nm Ge Fin Fabrication on Si substrate," Extended Abstracts of the 2009 International Conference on Solid State Devices and Materials, Sendai, pp. 175-175 (2009).
Notice of Reasons for Rejection, mailed Jan. 31, 2012, issued by Japanese Patent Office in JP 2010-012528, and English translation.

* cited by examiner

*Primary Examiner* — Quoc Hoang
(74) *Attorney, Agent, or Firm* — Finnegan, Henderson, Farabow, Garrett & Dunner, L.L.P.

(57) ABSTRACT

According to one embodiment, a semiconductor device having a Ge- or SiGe-fin structure includes a convex-shaped active area formed along one direction on the surface region of a Si substrate, a buffer layer of $Si_{1-x}Ge_x$ (0<x<1) formed on the active area, and a fin structure of $Si_{1-y}Ge_y$ (x<y≦1) formed on the buffer layer. The fin structure has a side surface of a (110) plane perpendicular to the surface of the Si substrate and the width thereof in a direction perpendicular to the one direction of the fin structure is narrower than that of the buffer layer.

8 Claims, 12 Drawing Sheets

| HN4OH : H2O2 : H2O (Volume ratio) | HN4OH : H2O2 (mol/L) | HN4OH : H2O2 (Mol concentration ratio) |
| --- | --- | --- |
| 250 : 1 : 0 | 9.470 : 0.069 | 138.04 : 1 |
| 500 : 1 : 0 | 9.490 : 0.034 | 276.08 : 1 |
| 1000 : 1 : 0 | 9.501 : 0.017 | 552.16 : 1 |
| 100 : 1 : 0 | 9.409 : 0.170 | 55.22 : 1 |
| 100 : 1 : 500 | 1.130 : 0.020 | 55.22 : 1 |
| 10 : 1 : 500 | 0.127 : 0.023 | 5.52 : 1 |

F I G. 7

| HC1 : H2O2 : H2O (Volume ratio) | HC1 : H2O2 (mol/L) | HC1 : H2O2 (Mol concentration ratio) |
| --- | --- | --- |
| 1 : 2 : 1000 | 0.011 : 0.023 | 0.49 : 1 |
| 10 : 2 : 1000 | 0.112 : 0.023 | 4.87 : 1 |
| 50 : 2 : 1000 | 0.545 : 0.022 | 24.35 : 1 |

SEMICONDUCTOR DEVICE AND FABRICATION METHOD THEREOF

CROSS-REFERENCE TO RELATED APPLICATIONS

This application is based upon and claims the benefit of priority from Japanese Patent Application No. 2010-012528, filed Jan. 22, 2010; the entire contents of which are incorporated herein by reference.

FIELD

Embodiments described herein relate generally to a semiconductor device having a Ge- or SiGe-fin structure and a fabrication method thereof.

BACKGROUND

Recently, attention is given to a Ge-FinFET having an FET formed with a Ge-fin structure formed on the bulk Si. The Ge-FinFET has some issues, such as deterioration in mobility due to non-uniformity of the channel plane orientation, variation in threshold voltage due to line-edge-roughness (LER) and variation in leakage current. In the prior art that the Ge layer is epitaxially grown on the region where the Si substrate is recessed after forming the STI on the Si substrate, it is not realized to make a (110) plane with high mobility on the channel side surface because the channel plane orientation becomes non-uniform due to the tapered shape caused by the STI (C-T Chung et. al., Ext. Abst. of 2009 Int. Conf. on SSDM (2009) pp 174-175).

Further, in the region in which the fin width is not larger than 50 nm and the fin pitch is not larger than 150 nm, it is difficult to apply a stress to the channel by using such as a contact etching stop liner (CESL) film due to the limited space in the S/D region. Further, it is difficult to efficiently apply a strain to the Ge-fin structure since a stressor itself is processed by fin etching if the stressor is inserted into the underlying layer.

DETAILED DESCRIPTION

In general, according to one embodiment, a semiconductor device having a Ge- or SiGe-fin structure includes a convex-shaped active area formed along one direction on the surface region of a Si substrate, a buffer layer of $Si_{1-x}Ge_x$ ($0<x<1$) formed on the active area, and a fin structure of $Si_{1-y}Ge_y$ ($x<y\leq 1$) formed on the buffer layer. The fin structure has a side surface of a (110) plane perpendicular to the surface of the substrate and the width thereof in a direction perpendicular to the one direction of the fin structure is smaller than that of the buffer layer.

Next, embodiments will be explained with reference to the accompanying drawings.

In the following embodiment, a tri-gate FinFET is explained as an example, but the present embodiment is not limited to the tri-gate FinFET and can be applied to another multi-gate structure having a plurality of gate electrodes. As another structure having a plurality of gate electrodes, for example, a double-gate structure in which gate electrodes are arranged on the upper and lower regions of the channel or both side surfaces thereof, a gate all-around structure in which, the peripheral region of the channel is surrounded by a gate electrode or the like is provided.

(First Embodiment)

Figure 1A:
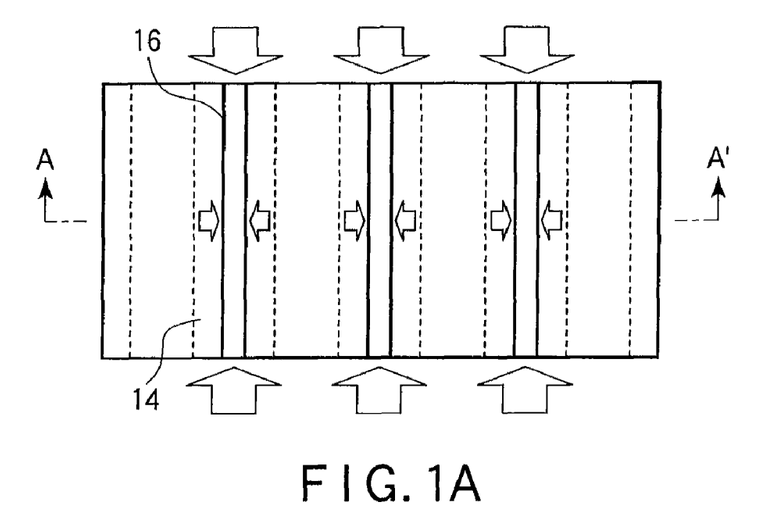
FIGS. 1A and 1B are the plan view and the cross-sectional view showing the schematic structure of the Ge-FinFET according to a first embodiment.
Figure 1B:
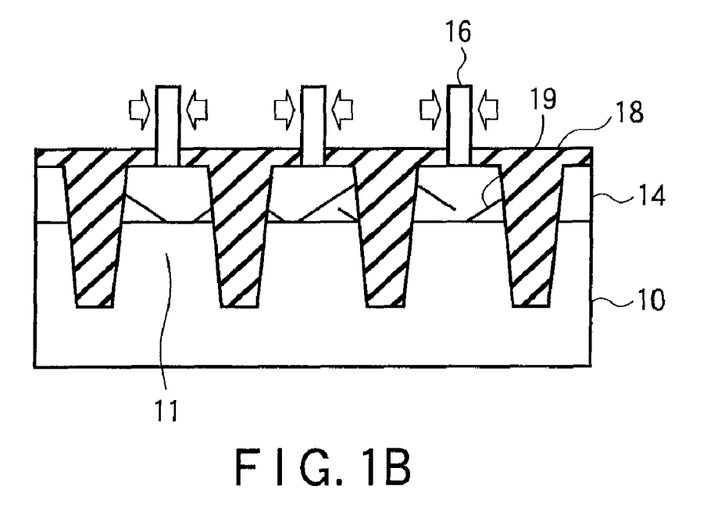

FIGS. 1A and 1B illustrate the schematic structure of a Ge-FinFET according to a first embodiment, FIG. 1A being a plan view as viewed from above and FIG. 1B being a cross-sectional view taken along line A-A' of FIG. 1A.

Active areas 11 whose cross-section is formed with a convex stripe form are formed by forming a plurality of device isolation trenches in parallel in the surface region of a Si substrate 10 having plane orientation (100). Relaxed SiGe layers ($Si_{1-x}Ge_x$ buffer layers) 14 are formed on the regions obtained by partly removing the surface regions of the active areas 11. Strained Ge layers ($Si_{1-y}Ge_y$ fin structure) 16 are formed on the relaxed SiGe layers 14. The Ge composition x of the relaxed SiGe layer 14 is 0.8, for example. The Ge layer 16 has small width in a direction perpendicular to the stripe direction and is used as a fin structure. Further, the plane orientation of the side surface of the Ge layer 16 is (110).

Since lattice strain in the relaxed SiGe layer 14 is relaxed, compressive stress is applied to the Ge fin structure 16 formed thereon with the relaxed SiGe layer 14 used as a stressor. That is, the Ge fin structure 16 is used as a strained Ge layer. In this case, the Ge fin structure 16 is long in the stripe direction, but is extremely short in a direction perpendicular to the stripe. Therefore, even if the fin width and fin pitch are further narrowing, the volume ratio of the relaxed SiGe layer 14 acting as a stressor and the Ge fin structure 16 can be set large. As a result, efficient stress application can be attained. Further, strain is relaxed to some extent in a direction perpendicular to the stripe, but sufficient strain is applied in the stripe direction.

A device isolation layer 18 is filled in the device isolation trenches formed in the substrate 10 and formed between the respective adjacent active areas 11. Further, the device isolation layer 18 is also formed above the active areas 11 to cover the bottom regions of the Ge fin structure 16.

Although not shown in the drawing, a Ge-FinFET is fabricated by forming a gate electrode above the side surfaces and upper surface of each Ge fin structure 16 with a gate insulating film disposed therebetween and forming source/drain regions in the Ge fin structure 16.

With the above structure, since the Ge fin structure 16 has a (110) plane on the side surface and has compressive strain in the channel lengthwise direction, a pMOSFET having an excellent characteristic can be realized. Further, since threading dislocations 19 of the relaxed SiGe layer 14 terminate at the side surface of the relaxed SiGe layer 14, the threading dislocation density in the Ge fin structure 16 can be greatly decreased.

Next, a fabrication method of the Ge-FinFET according to the present embodiment is explained.

Figure 2A:
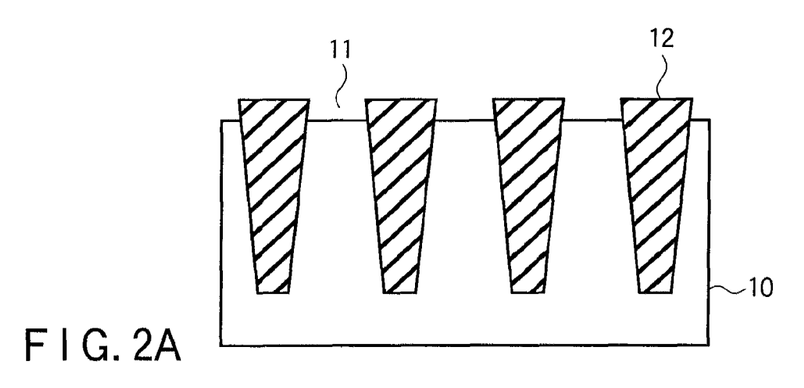
FIGS. 2A, 2B, 2C, 2D, 2E and 2F are the cross-sectional views showing a fabricating process of the Ge-FinFET according to the first embodiment.

First, as shown in FIG. 2A, a plurality of device isolation trenches are formed in parallel in the surface region of a Si substrate 10 in which the plane orientation of the surface is (100) by use of an RIE process. By forming the trenches, the active areas 11 having a convex cross-section are formed on the surface region of the substrate 10. Then, a STI (Shallow Trench Isolation) structure is formed by filling the first device isolation layer 12 such as silicon dioxide films in the trenches.

Figure 2B:
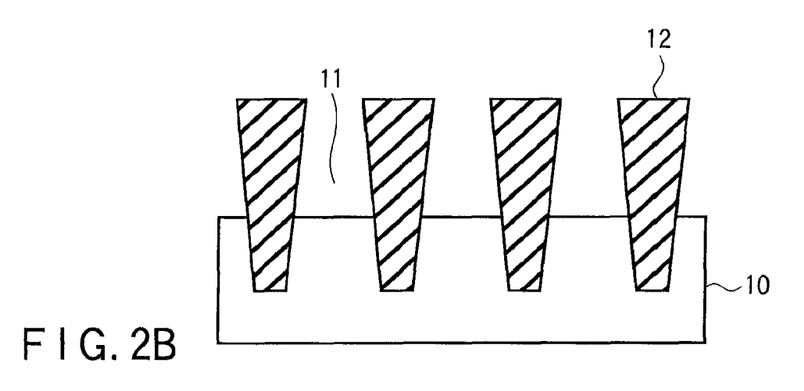

Next, as shown in FIG. 2B, the surface regions of the active areas 11 are removed by selective etching by performing a RIE process with the first device isolation layer 12 used as a mask. That is, a Si layer used as an active layer is subjected to a recess-etching process.

Figure 2C:
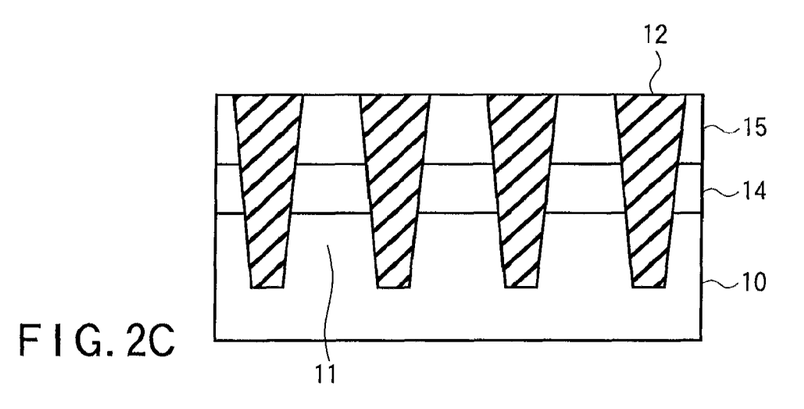

Then, as shown in FIG. 2C, a SiGe layer with the Ge composition (concentration) of 70% or more, for example, a $Si_{0.2}Ge_{0.8}$ layer (first semiconductor layer) 14 is selectively grown on the active areas 11 by performing a CVD or gas source MBE process. The SiGe layer 14 is completely relaxed. In order to completely make the lattice of the SiGe layer 14 relaxed, the SiGe layer 14 may be formed with a thickness larger than or equal to the critical film thickness. Specifically, the thickness may be set to 7 nm or more in the case of the Ge composition of 70%, 4 nm or more in the case of the Ge composition of 80% and 2 nm or more in the case of the Ge composition of 90%.

In this case, a punch-through stopper can be formed by previously doped n-type impurities such as As or P into the relaxed SiGe layer 14. Further, the density of threading dislocation into the Ge channel that continues to grow can be greatly reduced by termination of the threading dislocations 19 caused by lattice mismatching in the SiGe/Si interface at the side surface of a recess.

Generally, the threading dislocation 19 tends to be formed obliquely and if the SiGe layer 14 is continuously formed, the threading dislocation 19 reaches the surface of the SiGe layer 14. Therefore, the threading dislocation 19 is continuously formed to a Ge layer formed thereon. However, if the SiGe layer 14 is isolated by the STI regions and formed into infinitesimal regions, the rate of threading dislocations that reach the surface becomes extremely low. Therefore, the number of threading dislocations formed in Ge layers formed on the SiGe layers 14 can be reduced.

Next, Ge layers (second semiconductor layer) 15 used as channels grown on the relaxed SiGe layers 14 by using LPCVD method or the like. At this time, since the SiGe layer 14 is lattice-relaxed, biaxial compressive stress is applied to the Ge layer 15. Stress in a fin width direction may be relaxed depending on the width of the fin formed and uniaxial stress may be applied in some cases.

Figure 2D:
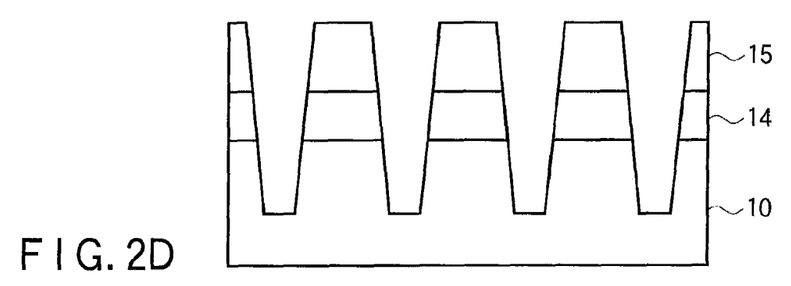

Next, as shown in FIG. 2D, the side surfaces with the Ge/SiGe/Si fin structure are exposed by removing the first device isolation layer 12 used as the STI regions by wet etching.

Figure 2E:
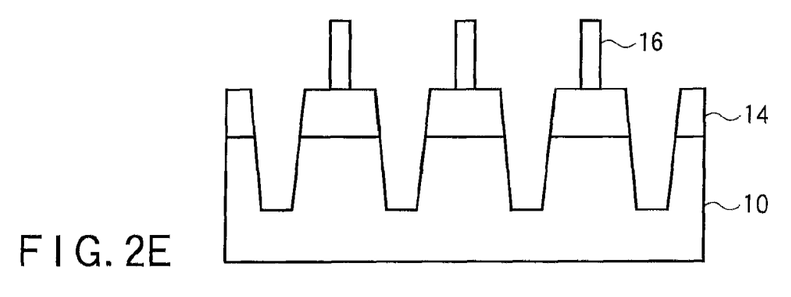

Then, only the Ge layers 15 are selectively etched as shown in FIG. 2E by using, for example, an alkali mixed solution (ammonia hydrogen peroxide: APM) of $NH_4OH$ (ammonium hydroxide):$H_2O_2$ (hydrogen peroxide)=250:1 (solution volume ratio) or a mixed solution (hydrochloric hydrogen peroxide: HPM) of HCl (hydrogen chloride):$H_2O_2$:$H_2O$=10:2:1000 (solution volume ratio). In this case, the concentrations of the $NH_4OH$ solution, $H_2O_2$ solution and HCl solution before they are mixed are respectively set to 25 wt %, 35 wt % and 35 wt %. In the etching process, anisotropic etching proceeds to preferentially leave behind the (110) plane of the Ge layer 15 and each Ge layer 15 is formed into a Ge fin structure 16 having a narrower width than that of the relaxed SiGe layer 14. In this case, the relaxed SiGe layer 14 acting as a stressor is not almost etched. Therefore, even if the fin width and fin pitch are narrowing, the volume ratio of the relaxed SiGe layer 14 used as the stressor and the Ge fin structure 16 can be made large and stress can be efficiently applied.

Figure 2F:
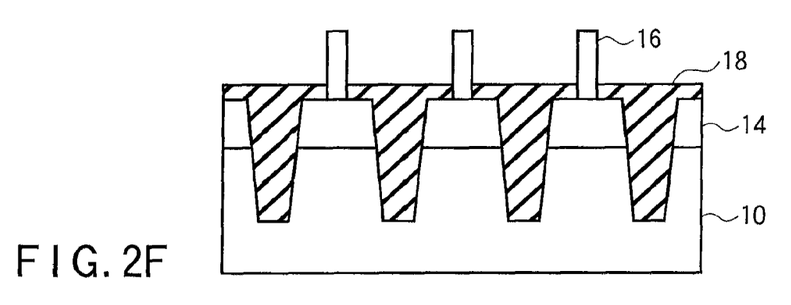

Next, as shown in FIG. 2F, a second device isolation layer 18 made of a silicon dioxide film is filled in the above structure to form a STI structure. After this, gate electrodes are formed on the side surfaces and upper surface of the Ge fin structure 16 with gate insulating films disposed therebetween to complete a FinFET.

The reason why the high-quality Ge fin structure having the (110) planes on the side surfaces thereof can be formed by performing an anisotropic etching process by use of a mixed solution of $NH_4OH$ and $H_2O_2$ or a mixed solution of HCl and $H_2O_2$ will be explained.

Figure 3A:
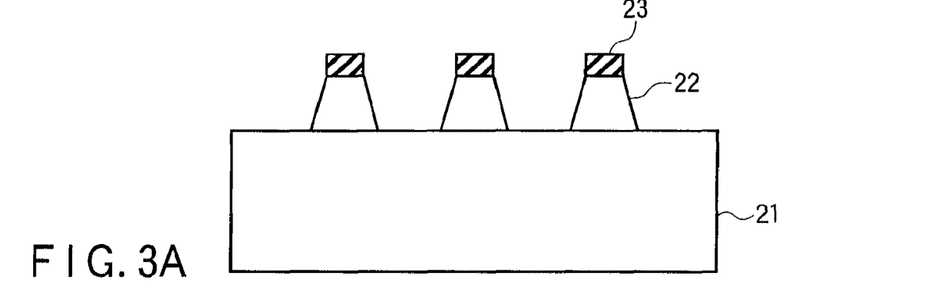
FIGS. 3A and 3B are views showing the cross-sectional shape and the plane shape (LER evaluation) after the Ge layer is selectively etched by using the RIE process.
Figure 3B:
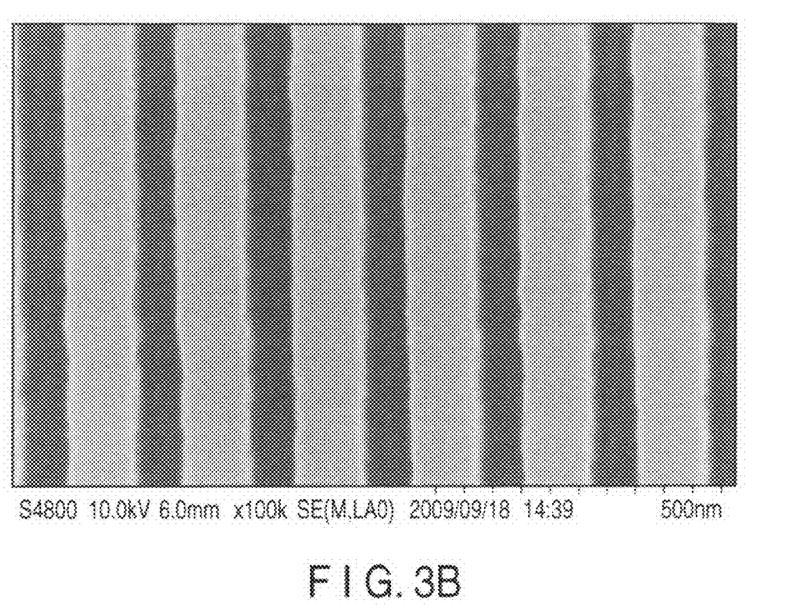
Figure 4A:
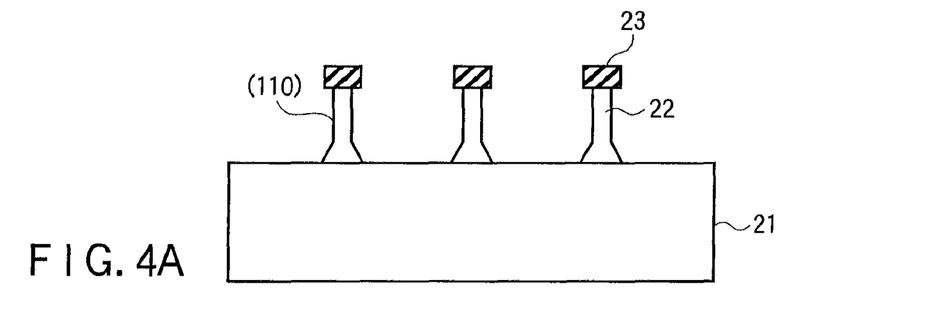
FIGS. 4A and 4B are views showing the cross-sectional shape and the plane shape (LER evaluation) after the Ge layer is subjected to the wet-etching process after the steps of FIGS. 3A and 3B.
Figure 4B:
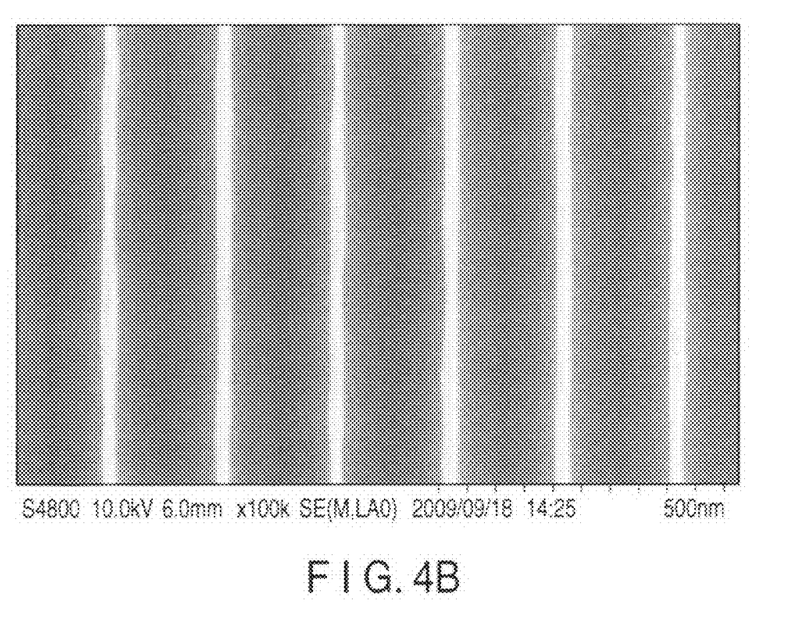

FIG. 3A is a cross-sectional view showing a state in which a Ge layer 22 is etched by use of a RIE process after stripe-form $SiO_2$ mask 23 (with a thickness of 30 nm) are formed on the Ge layer 22 (with a thickness of 300 nm) on a Si substrate 21. FIG. 3B shows a photograph taken by use of an electron microscope as viewing the state from above. FIG. 4A is a cross-sectional view showing a state in which the Ge layer 22 is etched by anisotropic etching by using a solution of $NH_4OH$:$H_2O_2$=250:1 with respect to the structure of FIG. 3A. FIG. 4B shows a photograph taken by use of an electron microscope as viewing the state from above. In the above cases, a plurality of Ge fin structures are formed and the surface roughness of each bottom portion of the side surface is evaluated.

As in the conventional case, a large surface roughness occurs on the bottom portion of the side surface of the Ge layer 22 as shown in FIG. 3B simply by patterning the Ge layer 22 by the RIE process. According to the experiments performed by the inventors of this application and others, a surface roughness of 3σ=10.9 nm was confirmed.

On the other hand, in this embodiment, the surface roughness of the bottom portion of the side surface of the Ge layer 22 was reduced as shown in FIG. 4B by performing a wet etching process by use of an alkali mixed solution of $NH_4OH$:$H_2O_2$=250:1 after patterning the Ge layer 22 by the RIE process. According to the experiments performed by the inventors of this application and others, it was confirmed that the surface roughness was reduced to 3σ=7.1 nm.

Thus, the surface roughness of the bottom portion of the side surface of the Ge layer can be reduced by performing an anisotropic etching process by wet etching after selective etching by the RIE process. That is, the mobility can be enhanced and variation in the threshold voltage can be reduced due to a reduction in the interface roughness scattering caused by reducing LER.

Figure 5:
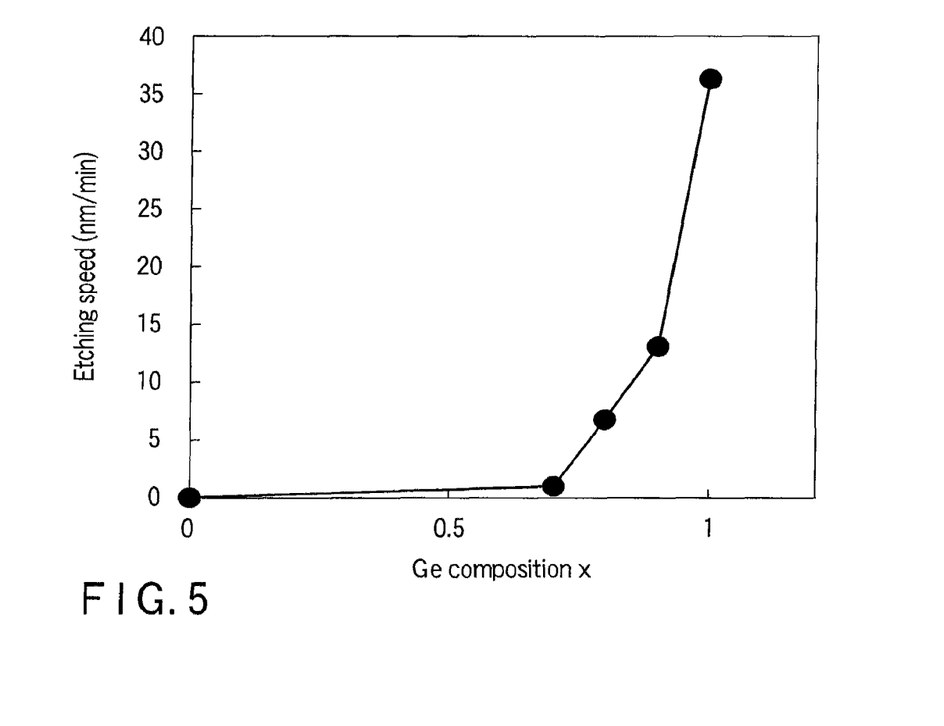
FIG. 5 is a characteristic diagram showing the relationship between the Ge composition of the SiGe layer and the etching rate in the HPM selective etching process.

Further, the result of investigations of selected ratio of etching of Ge and SiGe is shown in FIG. 5. This is the result obtained by evaluating the thickness of the SiGe layer after etching the SiGe layer for 80 seconds by using a solution of $HCl:H_2O_2:H_2O=10:2:1000$. The SiGe layer is not almost etched in the region that the Ge composition of SiGe is 70% or less and the etching rate increases as the Ge composition increases in a region in which the Ge composition of SiGe is higher than 70%. That is, the etching rate is reduced with a reduction in the Ge composition of the SiGe layer and the following selectivity is confirmed according to a variation in the Ge composition x. The selectivity indicates approximately 3 or more with respect to $Si_{1-x}Ge_x$ of Ge composition x=90% or less, the selectivity indicates approximately 5 or more with respect to $Si_{1-x}Ge_x$ of Ge composition x=80% or less and the selectivity indicates approximately 47 or more with respect to $Si_{1-x}Ge_x$ of Ge composition x=70% or less. In this case, the selected ratio indicates the ratio (Ge/SiGe) of the etching rate of Ge to the etching rate to SiGe.

Therefore, if the Ge composition x of the underlying SiGe layer is set to 70% or less, the upper Ge layer can be selectively etched. Further, if the Ge composition x of the underlying SiGe layer is set to 90% or less, the SiGe layer is slightly etched but the upper Ge layer can be selectively etched. It is safe to say that Ge can be selectively etched with respect to SiGe also in a case where a mixed solution of $NH_4OH$ and $H_2O_2$ is used.

In this embodiment, only the Ge channel region is selectively etched by anisotropic wet etching by use of a mixed solution of $NH_4OH$ and $H_2O_2$ (APM) or a mixed solution of HCl and $H_2O_2$ (HPM). After a $SiO_2$ film deposited on a Ge substrate is processed by the RIE process with a resist used as a mask, a fin is processed by the RIE process with the $SiO_2$ film used as a mask. As the result of anisotropic etching with respect to the fin by use of the above etching solution ($NH_4OH:H_2O_2=250:1$), a (110) plane is formed on a fin side surface in a vertical direction from directly below the mask as shown in the photograph taken by use of an electron microscope of FIG. 6 and it is confirmed that uniformity of the fin width is enhanced. Further, it was confirmed that LER is improved and the fin side surface (the surface perpendicular to the substrate surface) indicates anisotropy that preferentially leaves behind the (110) plane.

Figure 6:
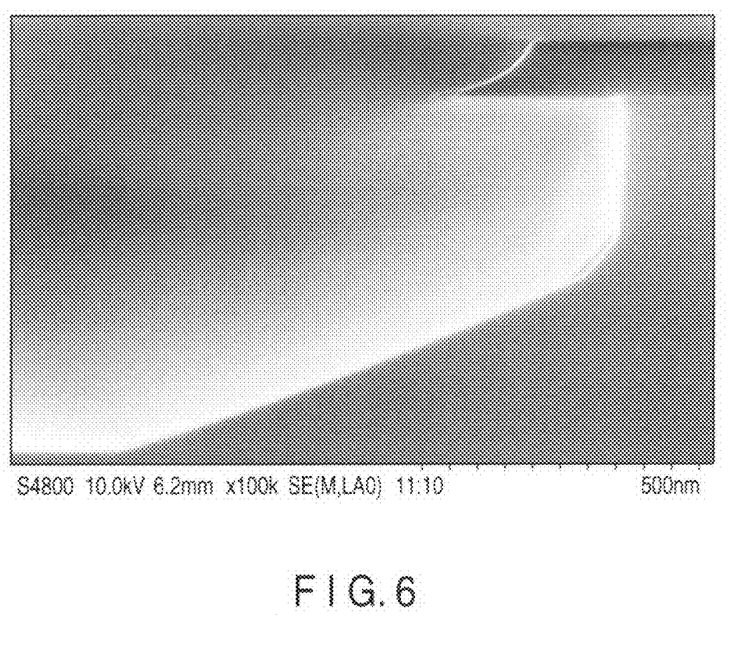
FIG. 6 is a view showing the cross-sectional shape after the Ge layer is selectively etched by using the APM.

Further, the etching profile is changed according to the concentration of APM. That is, the etching profile is changed according to the mixture ratio of $NH_4OH$ and $H_2O_2$. If the concentration of $NH_4OH$ is relatively high, that the etching surface is close to isotropic and a (110) plane of good quality appears on the etching side surface as shown in FIG. 6. However, if the concentration of $NH_4OH$ is excessively high (the concentration of $H_2O_2$ is excessively low), a complete isotropic state is attained, a (110) plane does not occur and the etching rate becomes extremely low. Further, if the concentration of $H_2O_2$ is excessively high (the concentration of $NH_4OH$ is excessively low), the anisotropic property of the etching cross section becomes strong, a (111) plane appears and a (110) plane does not occur.

Figure 7:
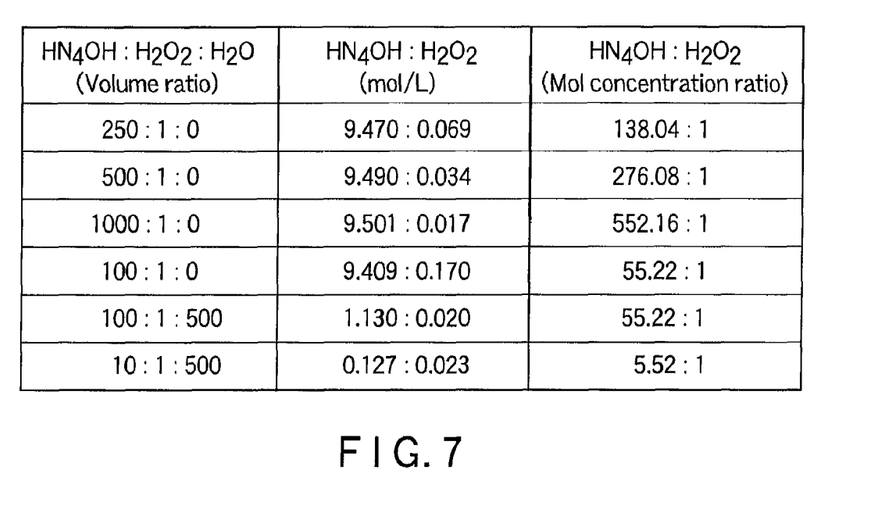
FIG. 7 is a table showing the concentration at which the (110) plane appears on the etching side surface when the etching process is performed by using the APM.

The inventors of this application and others performed experiments for etching by use of APM with various concentrations to detect the concentration with which the (110) plane appears on the etching side surface. The result is shown in FIG. 7.

If the mixture ratio is set to 1:1:500 (mol concentration ratio: 0.55:1), a (110) plane does not appear. Based on the result of the above experiments, it is understood that a (110) plane appears by setting the mol concentration ratio of $NH_4OH$ to 6 to 552 when $H_2O_2$ is set to 1. Therefore, in order to form a (110) plane on the etching side surface of the Ge layer, it is preferable to set the mol concentration ratio of $NH_4OH$ to 6 to 552. There is a possibility that a (110) plane appears even outside the above range, but it is confirmed by the results of the experiments performed by the inventors of this application and others that a (110) plane appears at least in the above range without fail. Further, the concentration of $H_2O$ has almost no relation to the etching profile, although it is related to the etching rate.

In the case of HPM, a substantially isotropic state is attained and a (110) plane of good quality appears on the etching side surface if the concentration of HCl is relatively low. However, if the concentration of HCl is excessively low (the concentration of $H_2O_2$ is excessively high), an anisotropic property becomes strong, a (111) plane appears and a (110) plane does not appear. Further, if the concentration of HCl is excessively high (the concentration of $H_2O_2$ is excessively low), a complete isotropic state is attained, a (110) plane does not appear and the etching rate becomes extremely low.

Figure 8:
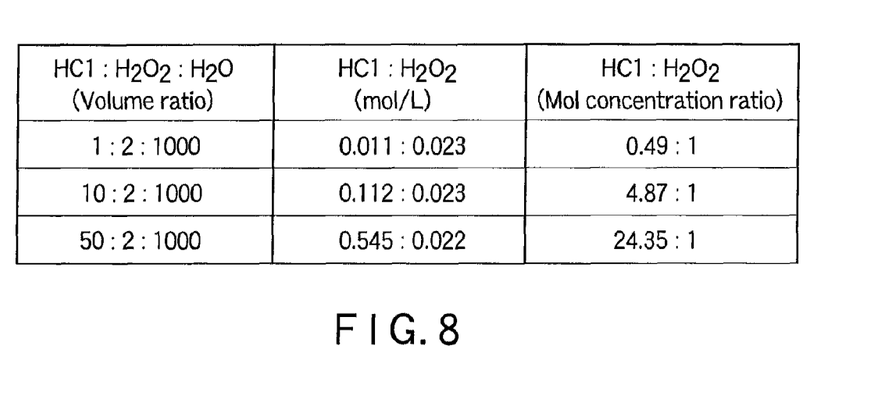
FIG. 8 is a table showing the concentration at which the (110) plane appears on the etching side surface when the etching process is performed by using the HPM.

The inventors of this application and others performed experiments for etching by use of HPM with various concentrations to detect the concentration with which the (110) plane appears. The result is shown in FIG. 8.

Based on the result of the above experiments, it is understood that a (110) plane appears by setting the mol concentration ratio of HCl to 0.5 to 24 when $H_2O_2$ is set to 1. Therefore, in order to form a (110) plane on the etching side surface of the Ge layer, it is preferable to set the mol concentration ratio of HCl to 0.5 to 24.

Figure 9A:
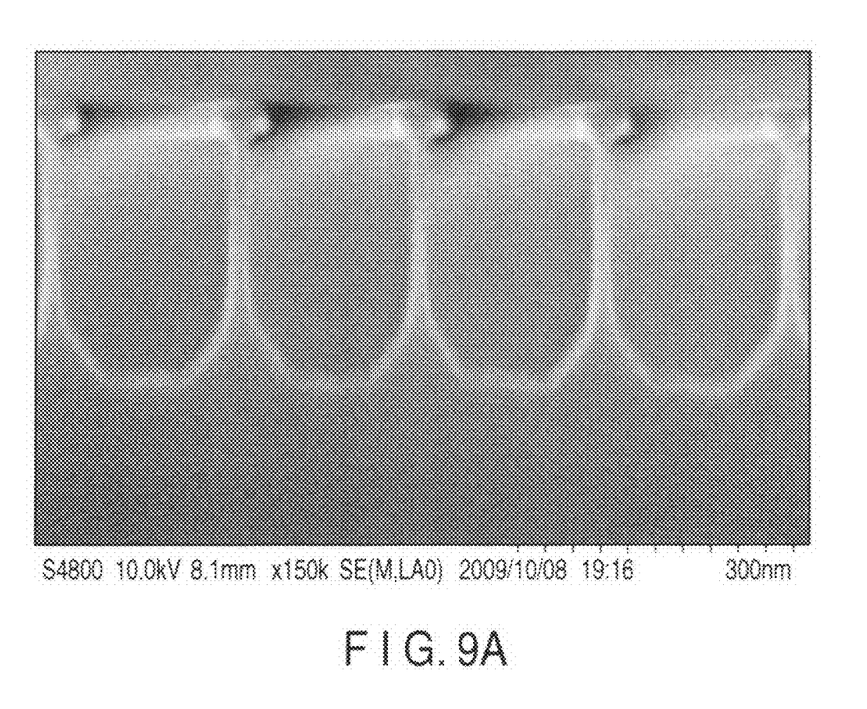
FIGS. 9A and 9B are views showing the cross-sectional shape after the Ge layer is selectively etched by using the HPM.
Figure 9B:
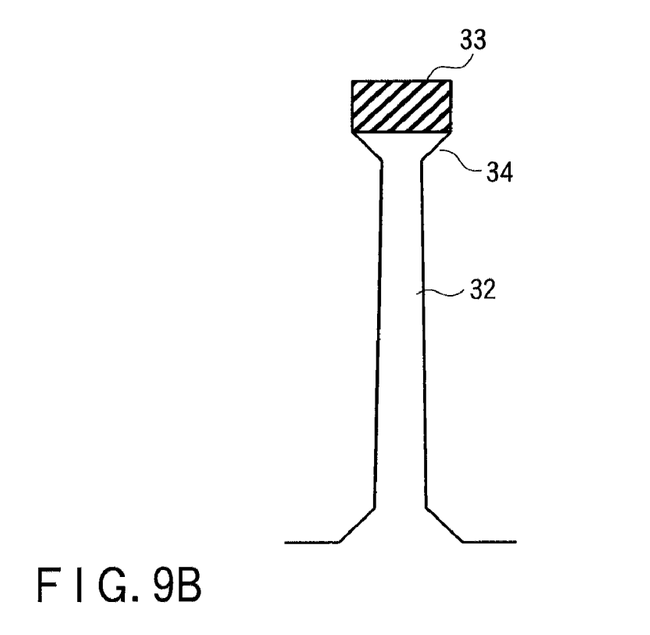
Figure 10A:
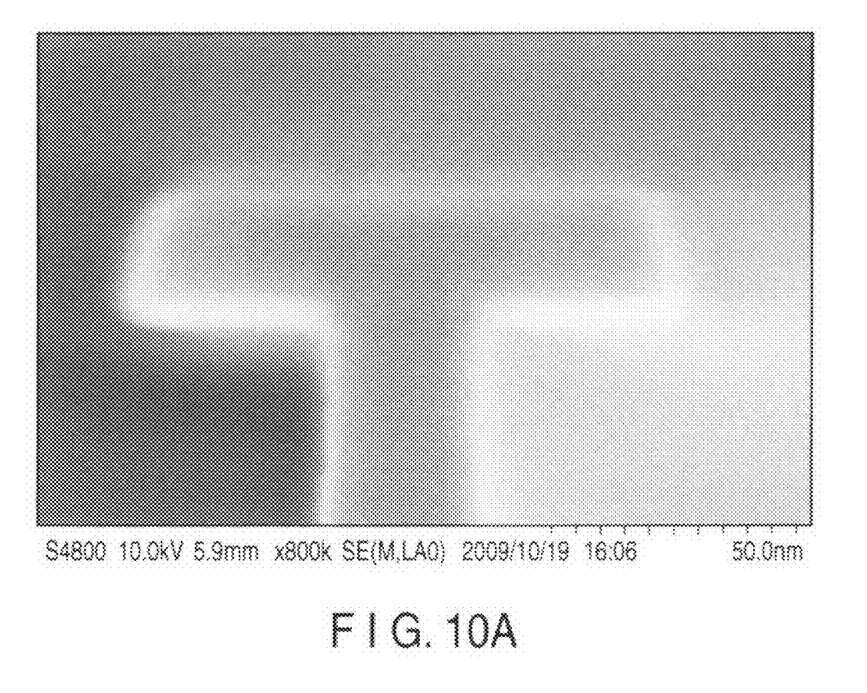
FIGS. 10A and 10B are views showing the cross-sectional shapes of the Ge layer which is selectively etched by using the APM after the steps of FIGS. 9A and 9B.
Figure 10B:
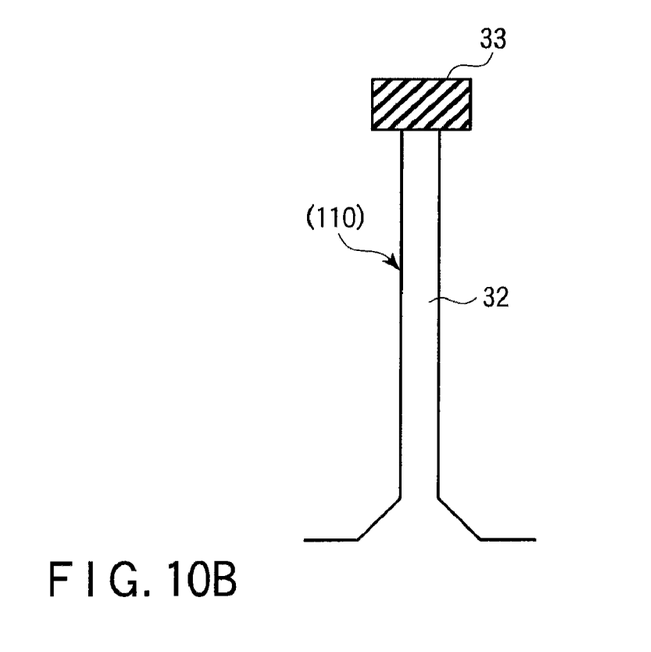

The result of etching for the Ge layer by use of HPM is shown in the photograph taken by use of an electron microscope of FIG. 9A and a cross-sectional schematic view of FIG. 9B. As the result of a Ge layer 32 being selectively etched by use of a $SiO_2$ mask 33, a (110) plane appears on the side surface of the Ge layer 32. However, an inversely tapered region 34 is left behind on the upper region of the Ge layer 32. In this case, the inversely tapered region 34 can be removed by etching by APM after etching by HPM as shown in the photograph taken by use of an electron microscope of FIG. 10A and a cross-sectional schematic view of FIG. 10B.

Therefore, if the inversely tapered region 34 does not cause any problem, the Ge fin structure formed by etching by HPM can be used as a FinFET forming substrate as it is. If the inversely tapered region 34 causes a problem, an etching process by APM may be performed after etching by HPM.

Thus, according to this embodiment, after the relaxed SiGe layer 14 used as an underlying stressor is inserted to form the fin structure, strain can be efficiently applied to the fine Ge fin structure 16 while maintaining the volume of the stressor by selectively etching only the upper Ge layer 15.

That is, degradation in mobility caused by non-uniformity in the channel plane orientation is suppressed and a (110) plane in which the mobility is high in a pMOSFET preferentially appears, which improves the mobility of a p-channel Ge-MOSFET and increases a current driving ability. Further, the mobility can be enhanced and a variation in the threshold voltage can be reduced due to a reduction in interface roughness scattering caused by reducing LER. In addition, the following effect can be attained in this embodiment.

After a STI structure is formed, a selective growth process is performed to completely relax a SiGe layer 14 with adequate film thickness in a region in which a Si region is recessed. At this time, since an epitaxial growth process is performed in local regions divided by the STI regions, the threading dislocation density of a Ge channel layer that is successively epitxially grown can be greatly reduced by termination of threading dislocations occurring in the SiGe/Si interface at the side surface of the SiGe layer 14. When a FET is formed in the Ge fin structure 16, a reduction in the threading dislocation density of this embodiment is effective for reducing the leakage current since threading dislocations in the channel and junction region cause junction leakage.

Further, a punch-through stopper that enhances immunity on the short-channel effect can be formed by forming a high-concentration impurity layer by in-situ doping during the epitaxial growth of the SiGe layer 14.

Biaxial compressive stress is applied to the Ge layer 15 by lattice mismatching between the SiGe layer 14 and Ge layer 15. However, a relaxation occurs in the gate width direction by selectively etching only the Ge layer 15 and uniaxial compressive stress is applied in the gate lengthwise direction that is effective in enhancing the mobility of the pMOSFET.

In a method for selective growth of the stressor on the S/D region or a method for applying stress to the channel by CESL, the following problem occurs. That is, in a infinitesimal device in which the gate pitch and fin pitch are reduced, effective stress application cannot be expected by a reduction in the space in which the stressor is buried together with the reduction in the pitch and the difference in the space causes a variation in the characteristic.

On the other hand, in this embodiment, uniform stress application can be attained irrespective of the gate pitch or fin pitch by forming the stressor on the underlying layer. Further, since the Ge channel is miniaturized by selective etching, the volume of the stressor can be kept large with respect to the channel layer and strain can be maintained even if the device is miniaturized.

Figure 11:
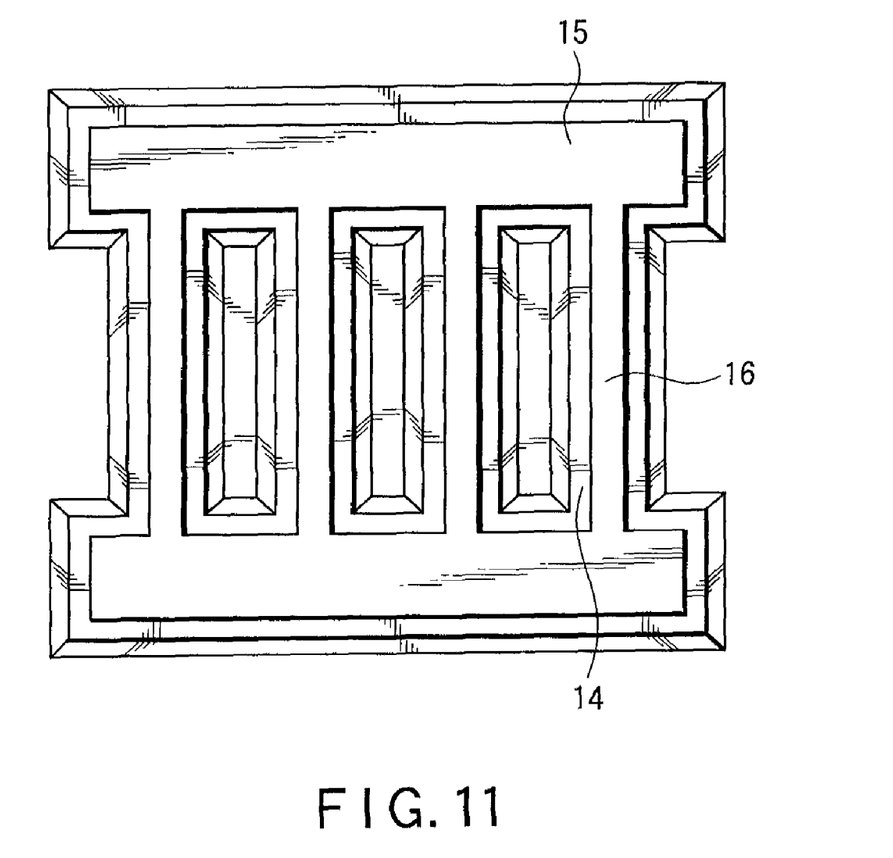
FIG. 11 is a plan view showing a pattern of the active area, for illustrating a modification of the first embodiment.

The active area is not necessarily divided in an island form as shown in FIG. 1A and may be formed with a configuration in which both ends of the stripe are connected as shown in FIG. 11. FIG. 1A can be applied to a case where a logic gate array or SRAM is formed and FIG. 11 can be applied to a case where a MOSFET with large capacity in which the sources and drains of a plurality of FETs are commonly connected is formed.

(Second Embodiment)

FIGS. 12A to 12H are cross-sectional views showing fabrication steps of a semiconductor device according to a second embodiment. Regions that are the same as those of FIGS. 2A to 2F are denoted by the same reference symbols and the detailed explanation thereof is omitted.

This embodiment is an example of a Ge-FinFET with a CMOS structure obtained by forming pMOSFETs and nMOSFETs on the same substrate.

Figure 12A:
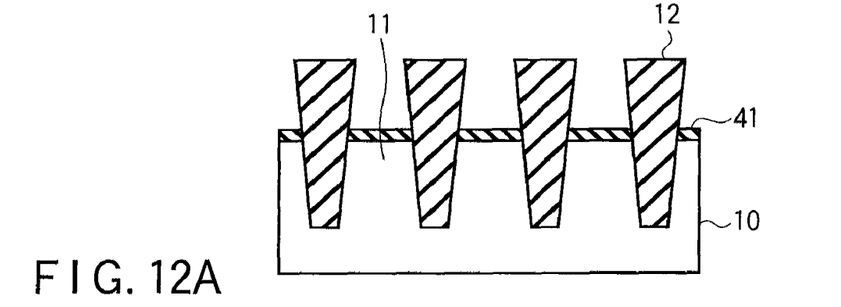
FIGS. 12A, 12B, 12C, 12D, 12E, 12F, 12G and 12H are cross-sectional views showing the fabricating steps of the Ge-FinFET according to a second embodiment.

First, as shown in FIG. 2A, after first device isolation layer 12 is buried in the surface region of a Si substrate 10 as in the case of the first embodiment, a thermal oxide film 41 is formed on the exposed Si surface (the surface of the active area 11) as shown in FIG. 12A.

Figure 12B:
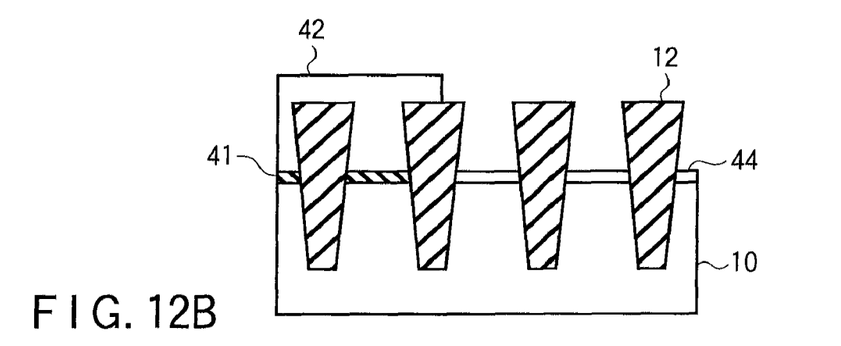

Then, after an nMOS region is masked with resist 42, the thermal oxide film 41 on a pMOS region is removed. Subsequently, a $Si_{0.2}Ge_{0.8}$ layer (first SiGe layer) 44 is epitaxially grown to a thickness of 10 nm, which is larger than the critical film thickness only on the pMOS region and the SiGe layer 44 is completely lattice-relaxed to form the structure as shown in FIG. 12B.

Figure 12C:
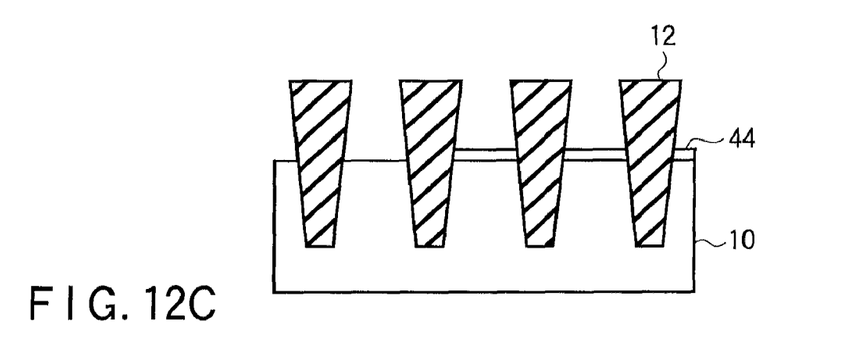
Figure 12D:
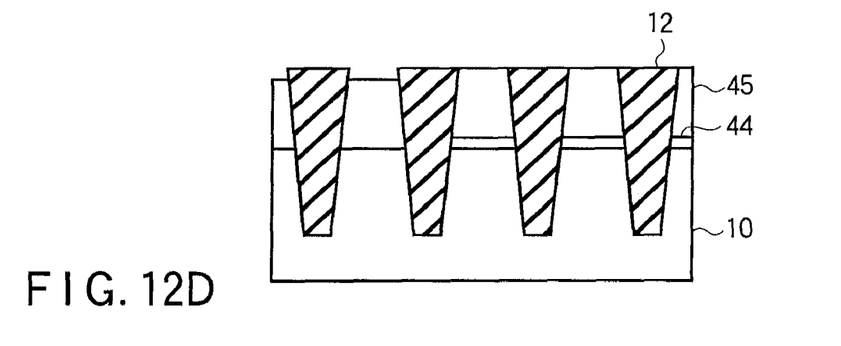

Next, as shown in FIG. 12C, after the thermal oxide film 41 on the nMOS region is removed, a Ge layer (second SiGe layer) 45 is epitaxially grown on both of the nMOS region and pMOS region as shown in FIG. 12D.

In this case, lattice strain caused by a difference between lattice constants is applied to the Ge layer 45 formed on the relaxed SiGe layer 44. On the other hand, if the difference between the lattice constants of Si and Ge is excessively large, lattice strain is not applied by completely lattice-relaxing the Ge layer 45 formed on Si. Further, since the film thickness of the SiGe layer 44 is as small as 10 nm, a step difference between the pMOS region and nMOS region does not cause any problem.

Figure 12E:
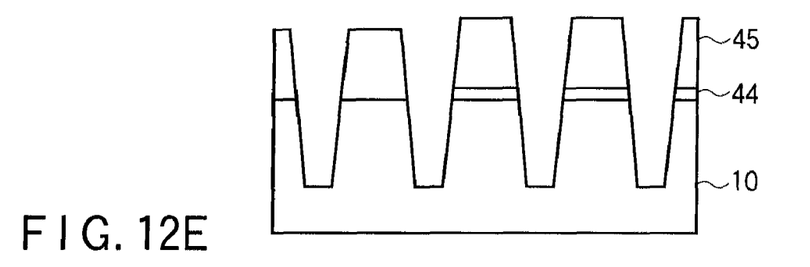

Next, as shown in FIG. 12E, the first device isolation layer 12 is removed by wet etching to expose the side surfaces of the fin structures.

Figure 12F:
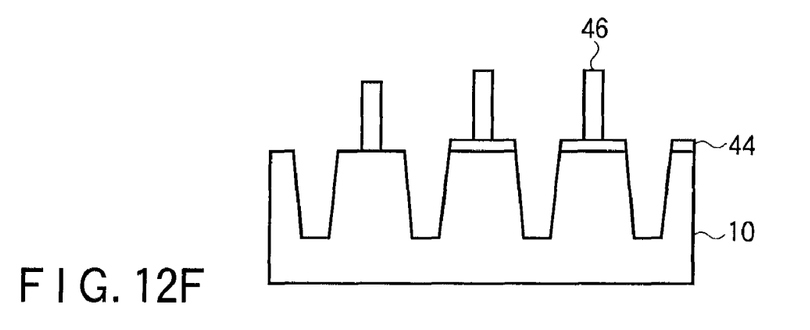

Then, as shown in FIG. 12F, the Ge layers 45 are selectively etched by anisotropic etching by use of an alkali mixed solution as in the first embodiment to narrow the width of the Ge layers 45 and expose (110) planes on the side surfaces. Thus, Ge fin structure 46 are formed.

Figure 12G:
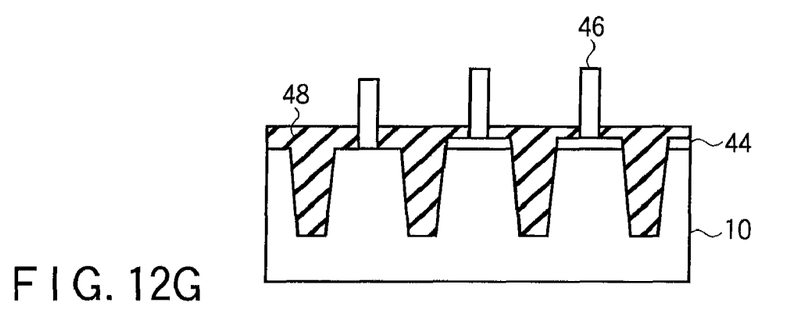

Subsequently, as shown in FIG. 12G, second device isolation layer 48 made of $SiO_2$ is buried and formed in the device isolation trenches to form an STI structure.

Figure 12H:
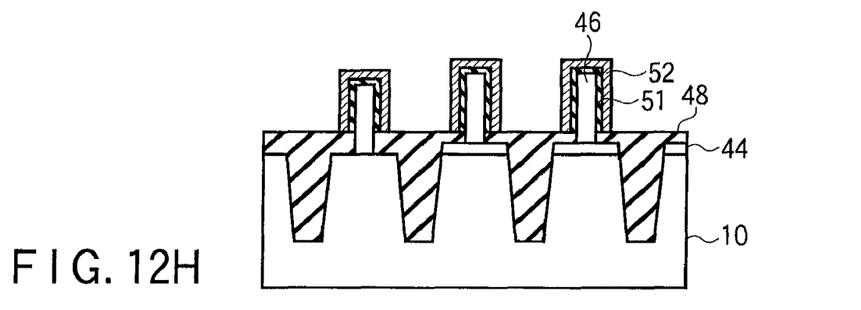

Then, as shown in FIG. 12H, gate electrodes 52 are formed above the side surfaces and upper surfaces of the Ge fin structure 46 with gate insulating films 51 disposed therebetween to form FinFETs of CMOS structures.

According to the present embodiment, the Ge fin structure 46 having the (110) planes formed on the side surfaces and having lattice strain in the channel lengthwise direction are formed in the pMOS region as in the first embodiment. Further, in the nMOS region, the Ge fin structure 46 having the (110) planes on the side surfaces and having relaxed lattice strain are formed. Therefore, FinFETs having pMOSs and nMOSs, both of which have excellent characteristics, can be formed.

(Modification)

This invention is not limited to the embodiments described above. The Ge fin structure is not necessarily made of Ge and may be made of $Si_{1-y}Ge_y$ with a higher Ge composition than the SiGe buffer layer. However, in order to set a sufficiently large etching selected ratio with respect to the SiGe buffer layer, the Ge composition thereof must be set higher than that of the SiGe buffer layer by 10% or more.

The Ge composition x of the SiGe buffer layer (first semiconductor layer) is not limited to 80% and may be set in a range of $0.7 \leq x \leq 0.9$. If the Ge composition becomes lower than 70%, the difference between the lattice constants with respect to the Ge layer (second semiconductor layer) becomes excessively large and strain cannot be applied to the second semiconductor layer. This is because the selected ratio with respect to the second semiconductor layer used as the fin structure cannot be attained if the Ge composition becomes higher than 90%.

Further, in the above embodiment, a case wherein the FinFET is used as an example is explained, but this invention is not limited to the FET and can be applied to another semiconductor device such as a pin photodetector having the Fin structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a convex active area formed along one direction on a surface region of a Si substrate,
a buffer layer formed on the convex active area, the buffer layer being made of $Si_{1-x}Ge_x$ ($0<x<1$), and
a fin structure formed on the buffer layer, the fin structure having a side surface perpendicular to the surface of the Si substrate, the fin structure being made of $Si_{1-y}Ge_y$ ($x<y\leq1$), a width of the fin structure in a direction perpendicular to the one direction being narrower than that of the buffer layer and plane orientation of the side surface of the fin structure being (110).

2. The semiconductor device according to claim 1, further comprising a device isolation layer formed on the Si substrate to sandwich the convex active area, an uppermost surface of the device isolation layer being set above an uppermost surface of the buffer layer.

3. The semiconductor device according to claim 1, wherein the buffer layer is formed by relaxing lattice strain and the fin structure is formed to have lattice strain.

4. The semiconductor device according to claim 1, wherein Ge composition x of the buffer layer is set in a range of $0.7\leq x\leq 0.9$, and Ge composition y of the fin structure is set in a range of $y\geq 0.9$ and $y\geq x+1$.

5. The semiconductor device according to claim 1, wherein the convex active area is formed in a plural form, the fin structures are formed on part of the convex active areas with the buffer layers disposed therebetween and the fin structures are directly formed on the remaining convex active areas.

6. The semiconductor device according to claim 1, wherein a plane orientation of the surface of the Si substrate is (100).

7. The semiconductor device according to claim 1, wherein a gate electrode is formed above the side surfaces and upper surface of the fin structure with a gate insulating film disposed therebetween and source/drain regions are formed in regions corresponding to the gate electrode in the fin structure.

8. The semiconductor device according to claim 7, wherein the fin structure, gate insulating film, gate electrode and source/drain regions configure a pMOSFET.

* * * * *